(12) United States Patent
Duraffourg et al.

(10) Patent No.: US 8,018,291 B2
(45) Date of Patent: Sep. 13, 2011

(54) TRANSISTOR-BASED MICROMETRIC OR NANOMETRIC RESONANT DEVICE

(75) Inventors: Laurent Duraffourg, Voiron (FR); Philippe Andreucci, Moirans (FR); Eric Colinet, Meylan (FR); Sebastien Hentz, Grenoble (FR); Eric Ollier, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 60 days.

(21) Appl. No.: 12/710,817

(22) Filed: Feb. 23, 2010

(65) Prior Publication Data
US 2010/0219895 A1    Sep. 2, 2010

(30) Foreign Application Priority Data
Feb. 27, 2009    (FR) ...................... 09 00903

(51) Int. Cl.
*H03B 5/30*    (2006.01)
(52) U.S. Cl. ................ 331/116 M; 331/154; 324/76.49; 324/76.11; 73/504.16; 73/514.16; 310/311; 310/317
(58) Field of Classification Search .................. 310/311, 310/317; 331/116 M, 154; 73/504.16, 514.16; 324/76.49, 76.11
See application file for complete search history.

(56) References Cited

U.S. PATENT DOCUMENTS
3,054,973 A   9/1962 Adams
6,448,103 B1  9/2002 Thomas
7,123,111 B2 * 10/2006 Brunson et al. .......... 331/116 M FOREIGN PATENT DOCUMENTS
FR          2 316 786        1/1977
WO    WO 2007/135064 A1     11/2007

OTHER PUBLICATIONS

Feng et al; "A Self-Sustaining Ultrahigh-Frequency Nanoelectromechanical Oscillator," Nature Nanotechnology, vol. 3, Jun. 2008, pp. 342-346.
Verd et al., "Monolithic CMOS MEMS Oscillator Circuit for Sensing in the Attogram Range," IEEE Electron Device Letters, vol. 29, No. 2, Feb. 2008, pp. 146-148.
Colinet et al. "Measurement of Nano-Displacement Based on In-Plane Suspended-Gate MOSFET Detection Compatible with a Front-End CMOS Process," ISSCC 2008, 18.2, pp. 332-333, and 617.
Bargatin et al., "Efficient Electrothermal Actuation of Multiple Modes of High-Frequency Nanoelectromechanical Resonators," Applied Physics Letters 90, 2007, pp. 1-3.
Mattila et al., "14 MHz Micromechanical Oscillator," Sensor and Actuators A 97-98, 2002, pp. 497-502.

* cited by examiner

*Primary Examiner* — Arnold Kinkead
(74) *Attorney, Agent, or Firm* — Oliff & Berridge, PLC

(57) ABSTRACT

The resonant device comprises an electromechanical resonator of nanometric or micrometric size that comprises a mobile element and a fixed element. Detection means provide detection signals representative of movement of the mobile element with respect to the fixed element to a feedback loop that is connected to an excitation input of the resonator. The resonator is formed on the same substrate as the detection means and feedback loop. The feedback loop comprises at most first and second transistors connected in series between a reference voltage and the excitation terminal. A capacitive load is connected between the excitation terminal and reference voltage. The detection signals control the conductivity of the first transistor.

12 Claims, 5 Drawing Sheets

_US 8,018,291 B2_

TRANSISTOR-BASED MICROMETRIC OR NANOMETRIC RESONANT DEVICE

BACKGROUND OF THE INVENTION

The invention relates to a resonant device comprising an electromechanical resonator of nanometric or micrometric size comprising a mobile element and a fixed element, detection means providing detection signals representative of movement of the mobile element with respect to the fixed element to a feedback loop connected to an excitation input of the resonator.

STATE OF THE ART

In order to be able to continue the race towards miniaturization, integrated circuits are having to integrate new functions and to make these new functions work on increasingly small scales. One of the major fields of study is integration of resonant devices within chips. Indeed, in a large number of fields, such as gas-phase chemical sensors, molecular force sensors or mass spectrometers, it is of interest for the integrated circuit to comprise at least one resonator. Designers are working on replacing the resonator, which is a discrete component, by an integrated resonator. By integrating this oscillator, it can then be hoped to obtain a gain in the energy consumed, in addition to the gain in surface area or in volume of the device, and an improvement of performances to constitute for example an integrated oscillator.

The resonator can for example be an electromechanical resonator advantageously of micrometric or nanometric size, for example presenting a mobile element of beam, plate, disk or nanowire type, or an electrical resonator which can be assimilated to a passive circuit of RLC type. The resonator comprises an excitation input which acts on the excitation means.

Numerous publications deal with electromechanical resonators of micrometric or nanometric size, i.e. resonators having dimensions compatible with those of integrated circuits. However, although it is an important point to obtain the resonator at a reasonable size, the electronic part that is associated thereto to transform a resonator into an oscillator also has to be compatible with the very stringent specifications of the integrated circuit.

Oscillators using an electromechanical resonator of micrometric or nanometric size have already been proven, but these resonators occupy a very large space, typically a surface area of about 100*100 $\mu m^2$. Resonators can therefore not be integrated on an integrated circuit. Most resonators of micrometric size in fact comprise a remote electronic circuit, i.e. an electronic circuit that is not made on the same substrate as the resonator. The resonator then has to be assembled to its operating circuit by complex methods.

An article by Feng et al. "A self-sustaining ultrahigh-frequency nanoelectromechanical oscillator" Nature nanotechnology, vol. 3, Jun. 2008, describes an oscillator that comprises an electromechanical resonator of nanometric size associated with a complex feedback circuit. The same is true of the oscillator presented by Verd et al. "Monolithic CMOS MEMS Oscillator Circuit for Sensing in the Attogram Range", IEEE Electron Device Letters, Vol. 29, No 2, Feb. 2008.

OBJECT OF THE INVENTION

The object of the invention consists in providing a resonant device, for example of oscillator type, that is easy to implement and that occupies a very small surface area.

The device according to the invention is characterized in that the resonator being formed on the same substrate as the detection means and feedback loop, the feedback loop comprises at most a first and second transistor connected in series between a reference voltage and the excitation input, a capacitive load being connected between the excitation input and reference voltage, the detection signals controlling the conductivity of said first transistor.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PREFERRED EMBODIMENTS OF THE INVENTION

Figure 1:
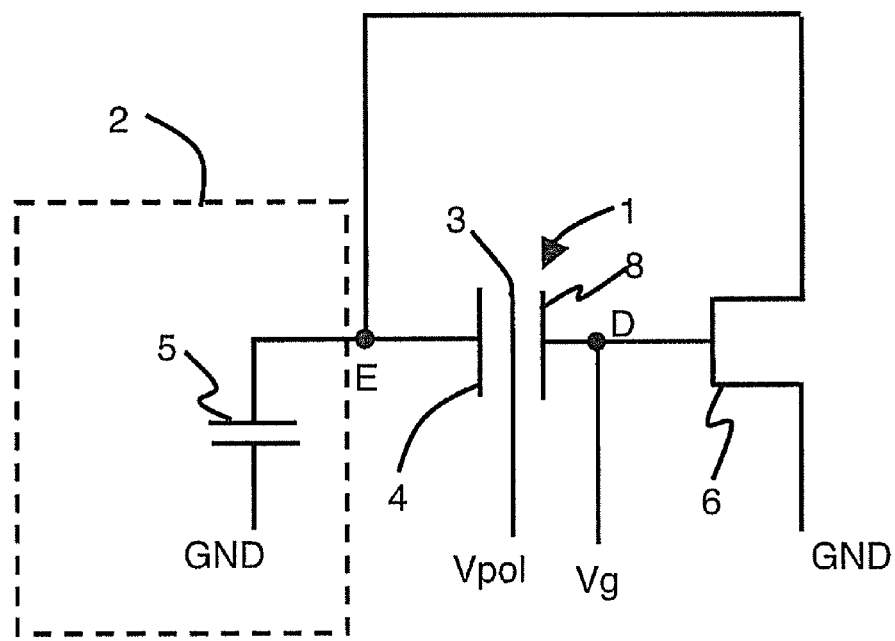
FIGS. 1 to 10 represent particular embodiments of an oscillator according to the invention.

As illustrated in FIG. 1, the resonant device forms an oscillator which comprises an electromechanical resonator 1 of micrometric or nanometric size and its associated oscillation circuit. The resonant device is connected to a bias element 2. Resonator 1 comprises a mobile element 3 and at least one fixed element 4. Mobile element 3 can oscillate with respect to fixed element 4. Fixed element 4 represents at least the excitation means of mobile element 3 of resonator 1. The excitation means are thus considered to form an integral part of resonator 1. Resonator 1 therefore comprises an excitation terminal E which controls the excitation force emitted by fixed element 4, also called excitation electrode.

The excitation means are advantageously of capacitive type or of thermo-elastic type, but they can also be of another type suitable for actuating mobile element 3.

The resonant device also comprises detection means of movement of mobile element 3 with respect to fixed element 4. The detection means convert the movement of mobile element 3 into an electrical signal which is then a signal representative of the position of mobile element 3 with respect to fixed element 4. The resonator therefore comprises a terminal D from which the signal representative of movement of mobile element 3 is transmitted to the outside and thereby to the feedback loop.

The detection means are advantageously of capacitive type or of piezo-resistive type, but they can also be of another type suitable for measuring the position of mobile element 3.

In the particular embodiment illustrated in FIG. 1, it is possible to use a resonator 1 that has an additional fixed element 8. This additional fixed element 8 can be associated to an additional excitation terminal. The additional fixed element is a detection electrode to improve decoupling of the excitation and detection signals. A bias voltage Vg is then applied on additional fixed element 8 in order to enhance control of the characteristics of resonator 1. Bias voltage Vg enables the operating point of first transistor 6 to be controlled. The additional excitation electrode is only usable for excitation of capacitive type.

Figure 2:
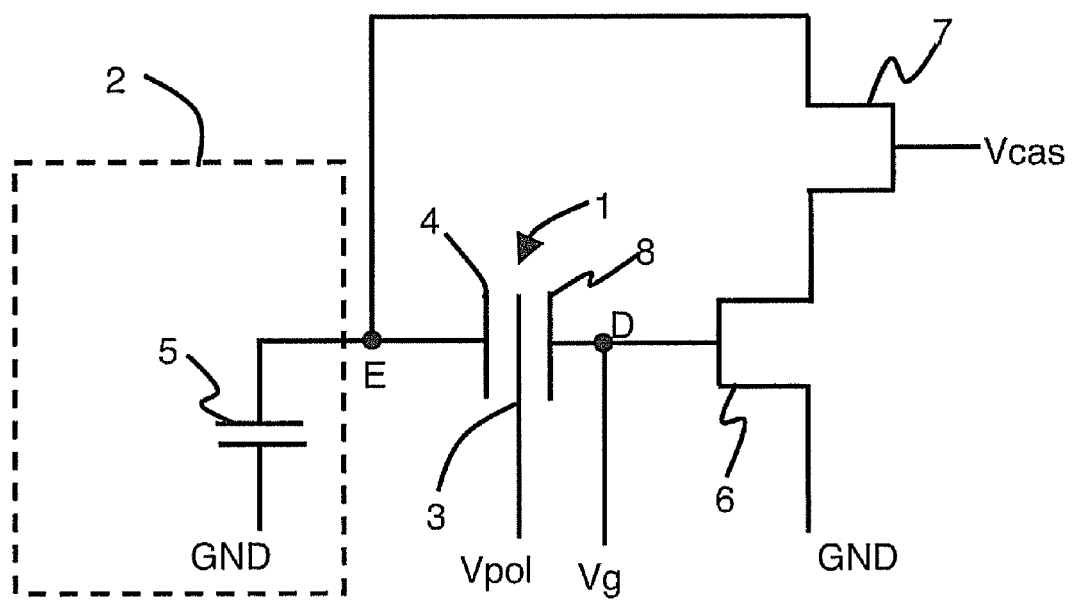
Figure 3:
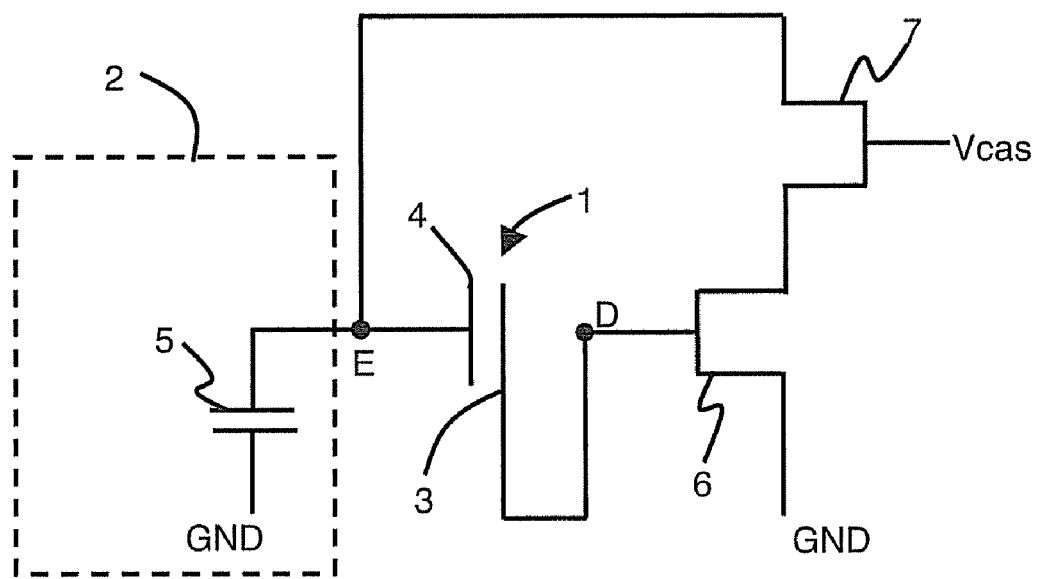
Figure 4:
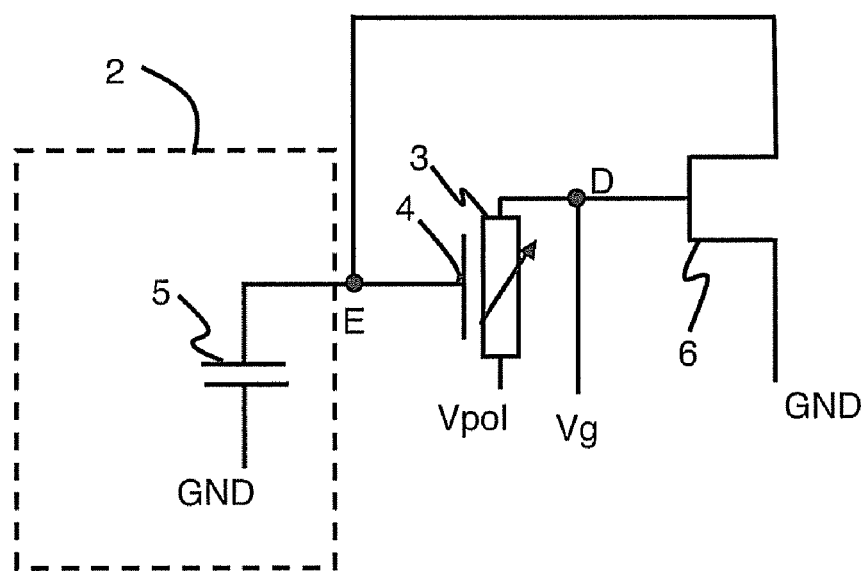
Figure 5:
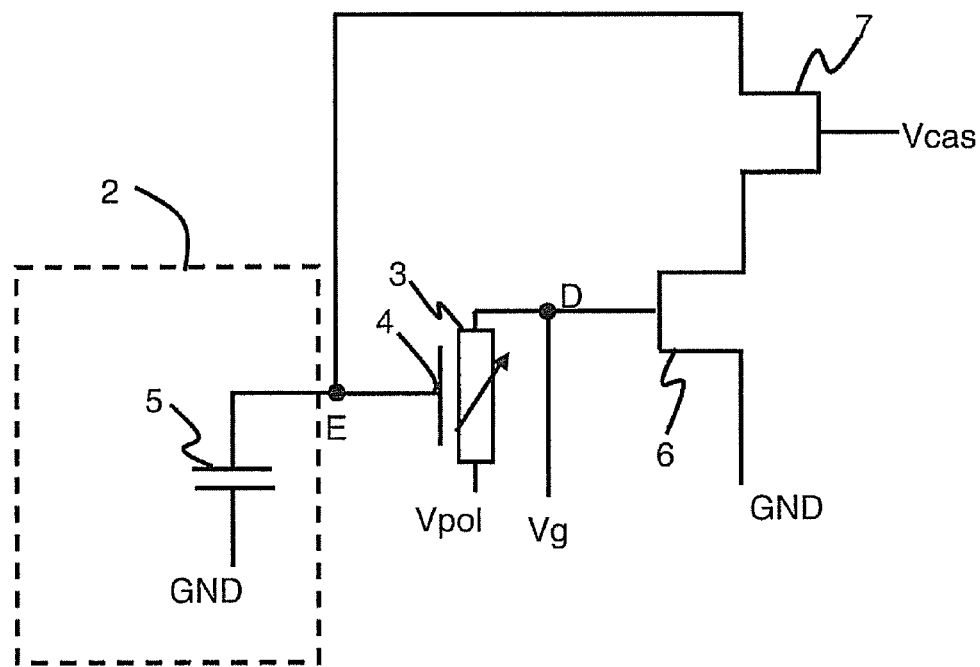

The detection means of movement of the mobile element can be achieved by additional fixed element 8 (FIGS. 1 and 2) or, in another embodiment, mobile element 3 can comprise or constitute the detection means (FIGS. 3, 4, 5).

In order to form an oscillator, the signal representative of movement of mobile element 3 of resonator 1 has to be transformed, in general amplified and phase shifted, so that the oscillation conditions are fulfilled. The transformed representative signal is then re-injected into resonator 1 by means of the excitation means, i.e. via its excitation terminal E.

Transformation of the signal is achieved in a feedback loop which connects the detection means to excitation terminal E and by the fact that bias element 2 comprises at least one capacitive load 5, here a capacitor. Capacitive load 5 is connected between excitation terminal E and reference voltage GND. The current signal, transmitted from resonator 1 by the detection means, is amplified and/or transformed into voltage and phase shifted by 90° or π/2 by means of capacitive bias element 2.

The detection means thereby provide detection signals representative of the movement of mobile element 3 with respect to fixed element 4 to feedback loop, which is connected to the excitation input of resonator 1.

The oscillation conditions are conventionally defined by the Barkhausen conditions. This results in the product of the transfer function H of the resonator by the transfer function G of the electronic circuit that is associated thereto having to have a gain greater than or equal to 1, and in the phase difference between the signals coming from resonator 1 and from the feedback loop having to be equal to 2.k.π with k an integer, at the resonance frequency.

Transfer function H of resonator 1 takes account of the mechanical characteristics of resonator 1 and of the transfer function of the excitation means. Transfer function H of resonator 1 is therefore a function of the mass, of the stiffness, and of the damping coefficient, i.e. of the geometrical parameters of the resonator and of its embedment conditions.

The transfer function of the associated circuit corresponds to the transfer function of the feedback loop and of the detection means. If the detection and excitation means are considered as being gains K, the Barkhausen conditions can be redefined in the following manner:

it suffices for the feedback loop to perform a phase shift equal to π/2 between the signal entering the feedback loop and the signal exiting the feedback loop and for the modulus of the associated circuit to be equal to the formula $$\|G(j\omega_0)\| = \frac{m_{eff}\omega_0^2}{K_{detect}, K_{excit}, Q}$$

in which:
$m_{eff}$ is the effective mass of the resonator,
$\omega_0$ is the resonance frequency,
$K_{detect}$ is the gain of the detection means,
$K_{excit}$ is the gain of the excitation means,
Q is the quality factor.

It results therefrom that, to form an oscillator, the feedback loop has to comprise devices that are able to perform the above phase shift and to ensure a sufficient gain to obtain self-sustained oscillations.

These conditions can be obtained by adding a first transistor 6 (FIG. 1) or a first transistor 6 and second transistor 7 mounted in series (FIG. 2) to the feedback loop. Second transistor 7 is an amplification transistor that amplifies the value of the current delivered on output from first transistor 6. The feedback loop therefore comprises at most two transistors connected in series, i.e. first transistor 6 and second transistor 7. In the following examples, capacitive load 5 is integrated in the feedback loop. In a particular embodiment (not represented), the capacitive load is formed by the metal interconnection tracks of the integrated circuit in which the first and second transistors are made. The feedback loop therefore only comprises a maximum of two transistors connected in series, but it can in addition comprise some passive elements, such as for example resistors and capacitors. In a particular embodiment, the feedback loop is formed solely by first transistor 6 or by first transistor 6 and second transistor 7.

In the resonant element, first transistor 6 is connected between a reference voltage GND and excitation terminal E. A second transistor 7 can be connected in series with first transistor 6 between reference voltage GND and excitation terminal E. First transistor 6 and second transistor 7 can be independently of field effect or bipolar type. First transistor 6 and second transistor 7 can thus be of the same type or of different types.

If first transistor 6 is of field effect type, a first source/drain electrode of first transistor 6 is connected to reference voltage GND. A second source/drain electrode is connected to excitation terminal E either directly or by means of second transistor 7.

Bias element 2 enables the operating regime of first transistor 6 or of first transistor 6 and second transistor 7 to be imposed and ensures phase shifting between the signal on terminal E and the signal on detection terminal D. Bias element 2 further enables mobile element 3 to be excited.

As illustrated in FIGS. 1 and 2, mobile element 3 can be biased by means of a bias voltage Vpol so as to modulate the oscillation characteristics of the resonator.

In the case of excitation and detection by capacitive means, it is advantageous to use two distinct electrodes, i.e. two fixed elements 4 and 8, arranged on each side of mobile element 3. One of the electrodes performs excitation of mobile element 3 and the other electrode performs detection of movement of mobile element 3. In this way, the electrostatic couplings are greatly reduced between the two electrodes. As illustrated in FIG. 3, it is also conceivable to use a resonator having a single fixed element 4 only. This single fixed element 4 then comprises the excitation means whereas the mobile element 3 comprises or constitutes the detection means.

The conductivity of first transistor 6 is controlled by the detection signals emitted by the detection means. Thus, depending on the position of mobile element 3 with respect to fixed element 4, the amplitude of the detection signal varies and makes the electric current flowing between the two terminals of first transistor 6 vary.

Resonator 1 can be with in-plane movement or with out-of-plane movement. Resonator 1 can for example be a resonator of embedded-free beam type (single embedment) or embedded-embedded beam type (double embedment) or of any other known type.

The use of a feedback loop only comprising at most two transistors 6 and 7 is particularly advantageous as it enables the feedback loop to be integrated very close to resonator 1, which enables the surface occupied by the resonant element to be greatly reduced. Furthermore, stray capacitances are also greatly reduced, these capacitances being responsible for a loss of useful signal and the occurrence of background noise preventing any possible oscillation.

First transistor 6 being located very close to resonator 1, the influence of stray capacitances is negligible compared with the input capacitance of transistor 6 and with the static capacitance of resonator 1.

Biasing of first transistor 6 is achieved by means of bias element 2 which is connected with first transistor 6 or second transistor 7 (if the latter exists) to excitation terminal E.

In a particular embodiment of the oscillator, excitation and detection are of capacitive type. As illustrated in FIG. 1, the feedback loop is formed by first transistor 6 the control electrode whereof, the gate or base electrode, is connected to the detection means, i.e. to terminal D. In this way, the detection means modulate the conductivity of first transistor 6. The current delivered by first transistor 6 can be amplified or not to control the actuating force produced by the excitation means.

In another embodiment of the resonator, excitation can be of capacitive type and detection of piezoresistive type, for example by using a mobile element of nanowire type. As illustrated in FIGS. 4 and 5, the nanowire is connected between bias voltage Vpol and detection terminal D. The nanowire, acting as mobile element 3, is then actuated by the excitation means. As in the previous embodiments, the feedback loop is constituted by a first transistor 6 (FIG. 4) or by a first transistor 6 and second transistor 7 (FIG. 5).

Figure 6:
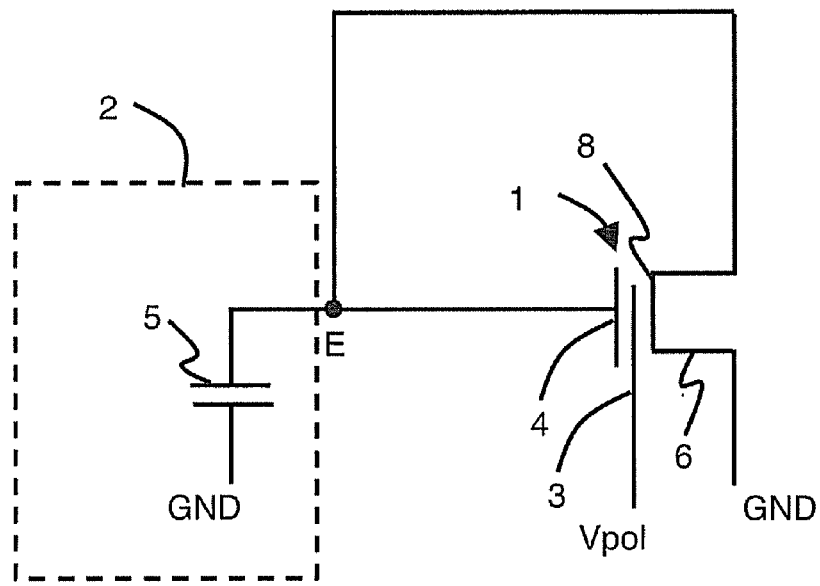

As illustrated in FIG. 6, resonator 1, excitation means and the detection means can be formed by a suspended-gate transistor. This embodiment has in particular been described in an article by Colinet et al. "Measurement of Nano-Movement Based on In-Plane Suspended-Gate MOSFET Detection Compatible with a Front-End CMOS Process" ISSCC 2008, 18.2 and in the document WO 2007135064. In this embodiment, first transistor 6 is a field effect transistor and its gate is formed at least partially by mobile element 3 of resonator 1. This results in the MOS capacitance value between the channel and mobile element 3 varying according to the position of mobile element 3 with respect to the channel. The channel of first transistor 6 then acts as detection means, i.e. as fixed element 4, which controls the conductivity of first transistor 6.

Figure 7:
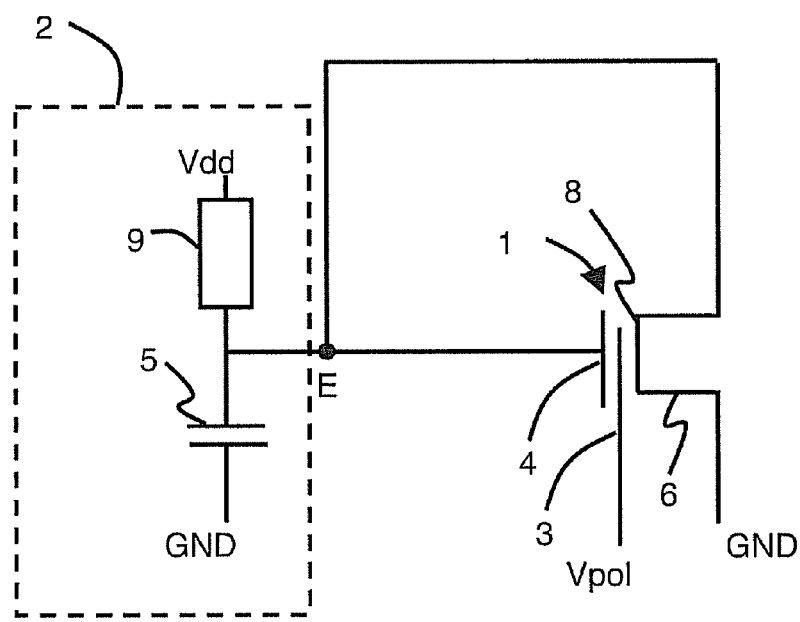

As illustrated in FIG. 7, for this type of oscillator, bias element 2 can comprise a capacitor 5 connected in series with a bias resistor 9 to the terminals of a power supply Vdd. In this case, the terminal common to resistor 9 and capacitor 5 is connected to excitation terminal E.

For example purposes, if the resonator is of embedded-embedded beam type, its length is equal to 14 µm and its width is equal to 1 µm. The beam has a thickness equal to 340 nm and the distance between the beam and the excitation and detection electrodes is equal to 100 nm. The surface area of each electrode is equal to $14*0.34 \, \mu m^2$. This type of resonator typically has a quality factor equal to 1000 at no-load. The effective mass of the resonator is about $14.8*10^{-11}$ g, and its effective stiffness is equal to 100.9 N/m. The resonance frequency of the resonator is equal to 4.6 MHz.

Figure 8:
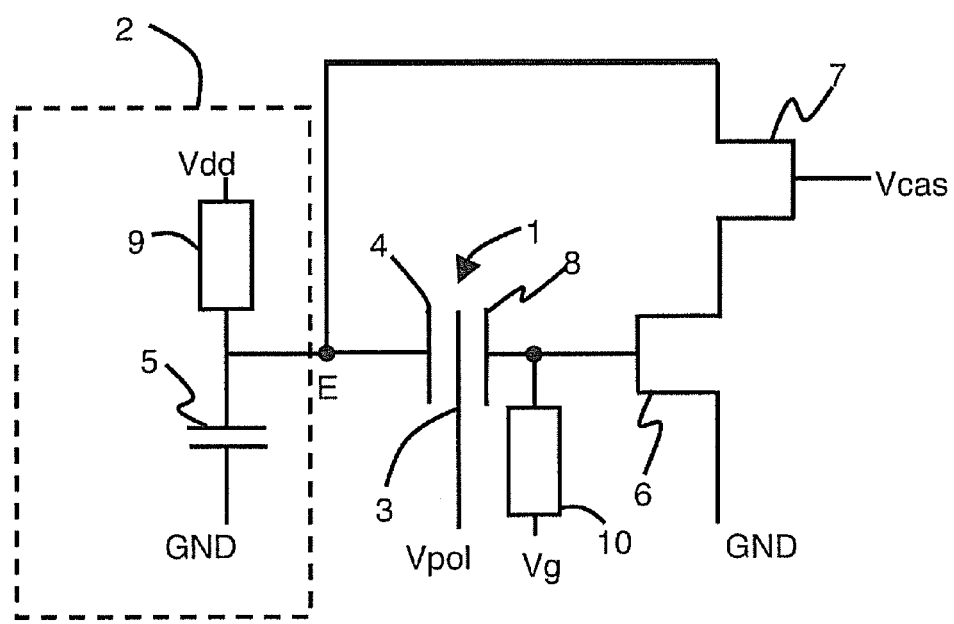

In this example illustrated in FIG. 8, bias element 2 is formed by a bias resistor 9 connected between a supply voltage Vdd and excitation terminal E and by capacitor 5 connected between excitation terminal E and reference voltage GND. Furthermore, the detection signal emitted by the detection means is biased by means of an additional resistor 10 to which additional voltage Vg is applied. Resistors 9 and 10 have a resistance of less than 10 MOhm, and the bias voltage applied to excitation terminal E is equal to 5V. If the capacitances of first transistor 6 and of capacitor 5 of bias element 2 are respectively equal to 10 fF and 0.5 pF, the feedback loop must have a minimum transconductance equal to 29.6 µS. In this example, a second transistor 7 is of no purpose as such a transconductance value can easily be attained by a single transistor.

Figure 9:
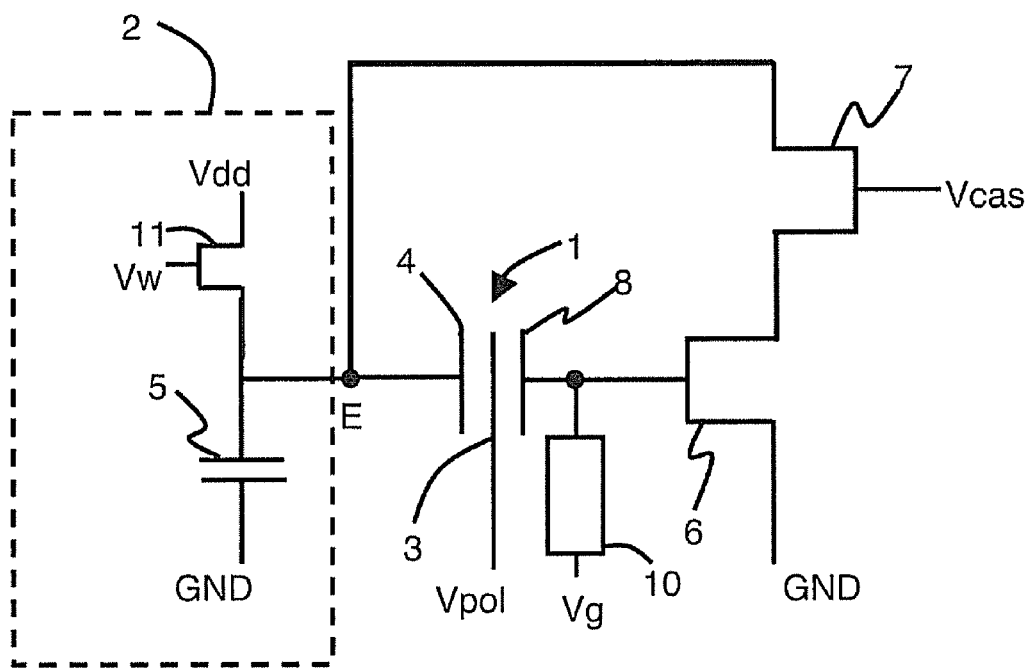

As illustrated in FIG. 9, it is also possible as a variant to replace bias resistor 9 by a third transistor 11 that is connected between excitation terminal E and supply voltage Vdd. In this case, the bias Vs applied on the control terminal of the third transistor enables the bias current to be adjusted. The preset voltage Vs applied to the control electrode of third transistor 11 enables the operating regime of the transistor to be fixed. The voltage Vs can be equal to that of the excitation terminal, the control electrode then being connected to the excitation terminal. It is also conceivable to use an external power source for fixing the preset voltage Vs.

Figure 10:
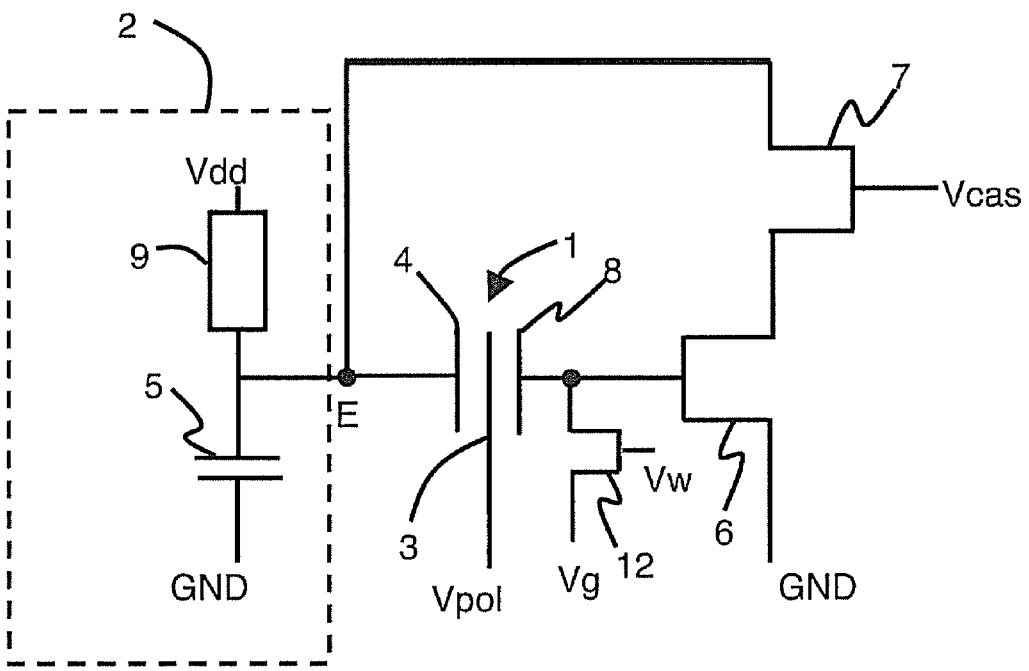

In another alternative embodiment, first transistor 6 is biased by means of an additional resistor 10 that is connected between the detection terminal and the control electrode of first transistor 6. In a particular embodiment illustrated in FIG. 10 and that can be combined with the other embodiments described, it is also possible to achieve this additional resistor by means of a fourth transistor 12. The second preset voltage Vw that is applied to the control electrode of fourth transistor 12 is a constant voltage. This second preset voltage Vw is advantageously equal to that of additional fixed element 8 or a voltage originating from an external source.

In yet another embodiment, it is also possible to achieve an oscillator that is formed by a resonator 1 excited by capacitive means and detection of movement of which is performed by piezoresistive means, for example in an out-of-plane movement.

In this embodiment, the excitation electrode is advantageously arranged under mobile element 3, typically a double-embedded beam. A piezoresistive force sensor is arranged on the beam and when the latter deforms, the sensor sees its resistance vary. It is thereby possible to detect movement of the beam by measuring the resistance of the sensor.

As in the previous embodiments, the transconductance of feedback loop transistors 6 and 7 has to take account of the gains of the detection means of piezoresistive type and of the gains of the excitation means. The trans-conductance also has to take account of the phase noises associated with the resonator, with first transistor 6, with second transistor 7 if applicable, and with the piezoresistive sensor.

For example purposes, if the resonator is of embedded-embedded beam type, its length is equal to 14 µm its width is equal to 340 µm. The beam has a thickness equal to 160 nm and the distance between the beam and the excitation and detection electrodes is equal to 100 nm. The surface area of each electrode is equal to $14*0.34 \, \mu m^2$. This type of resonator typically has a quality factor equal to 1000 at no-load. The effective mass of the resonator is about $14.8*10^{-11}$ g, and its effective stiffness is equal to 3.57 N/m. The resonance frequency of the resonator is equal to 7.8 MHz. The sensor is of AlSi type with a sensor factor equal to 2. The length of the excitation electrode is equal to a quarter of the length of the beam. The gain of the detection means is equal to 0.45 $Ohm.nm^{-1}$ Bias element 2 is formed by bias resistor 9 connected between a supply voltage Vdd and excitation terminal E and by capacitor 5 connected between the excitation terminal and reference voltage GND. Furthermore, the detection signal emitted by the detection means is biased by means of additional resistor 10. The resistance values of resistors 9 and 10 are respectively less than 10 MOhm and equal to 50 Ohm, and the bias applied to excitation terminal E is equal to 5V. The capacitances of first transistor 6 and of capacitor 5 of the bias element are respectively equal to 10 fF and 0.5 pF. The voltage applied to the piezoresistive sensor is equal to 1V. Under these conditions, the feedback loop must have a minimum trans-conductance equal to 156 µS. In this example, a second transistor is of no purpose as such a trans-conductance value can easily be attained by a single transistor.

In another embodiment, it is also conceivable to achieve an oscillator that comprises a resonator 1 with capacitive actuation and piezoresistive detection. This resonator can for example have an in-plane movement. The leverage arm of resonator 1 is actuated by an electrostatic force and its oscillation movement induces compression/expansion stresses in the sensors placed perpendicularly to this leverage arm.

In a variant of the previous embodiment, resonator 1 is formed by a nanowire. Excitation is performed by capacitive means and detection is performed by piezoresistive means. The nanowires do in fact present a very great piezoresistance effect which enables a very high transduction gain of the detection means to be obtained. This embodiment is particularly advantageous as the electronic gain that the feedback loop has to provide is all the lower. The resonator can be obtained using the nanowire as variable resistance connected to first transistor 6, the resistance variation being induced by deformation of the nanowire.

In yet another embodiment, the excitation means are of thermal type whereas the detection means are of piezoresistive type. Such an implementation has been proposed by Bargatin et al. "Efficient electrothermal actuation of multiple mode of high-frequency nanomechanical resonators", Applied Physics Letters 90, 2007.

The topology of the oscillator is of Colpitts type, and first transistor 6 or first transistor 6 and second transistor 7 are biased by means of capacitive bias element 2. Bias element 2 then acts as a trans-impedance amplifier which is used to convert the dynamic current coming from resonator 1 into a suitable voltage on excitation terminal E.

An amplification voltage Vcas is applied to the control electrode of second transistor 7 so as to be able to adjust the current emitted on output thereof and therefore the bias applied on the excitation terminal.

This architecture constitutes a co-integrated hybrid resonator/first transistor active component dedicated to the oscillator function. The different elements of the oscillator are then biased to fix the gain of first field-effect transistor 6 and phase shifting of the signal.

This circuit is particularly advantageous as the reduction of size of resonator 1 enables a mobile element to be obtained that is situated in immediate proximity to the fixed detection and excitation elements. Due to this size reduction, the gains of the transduction devices are then as a result greatly increased, particularly with the use of a nanowire. The feedback loop therefore has to present a natural gain that is typically that of a transistor or of two transistors in series.

A feedback loop formed by one or two transistors is quite realistic as the transconductance of the feedback loop is a function of the geometric parameters of resonator 1 and of the excitation and detection means that are associated thereto.

Furthermore, producing the resonator, feedback loop and detection means on the same substrate makes for a better integration density. This in particular enables a matrix of resonant devices to be made on the substrate. For example purposes, a resonant device with its electronic feedback circuit of about 100 $\mu m^2$ can be achieved.

The invention claimed is:

1. A resonant device comprising an electromechanical resonator of nanometric or micrometric size comprising a mobile element and a fixed element, detection means providing detection signals representative of movement of the mobile element with respect to the fixed element to a feedback loop connected to an excitation input of the resonator, device characterized in that the resonator being formed on the same substrate as the detection means and feedback loop, the feedback loop comprises at most a first transistor and a second transistor connected in series between a reference voltage and the excitation input, a capacitive load being connected between the excitation input and reference voltage, the detection signals controlling the conductivity of said first transistor.

2. Device according to claim 1, wherein a bias resistor is connected between the excitation input and a supply voltage.

3. Device according to claim 1, wherein a third transistor is connected between the excitation input and a supply voltage, a control electrode of said third transistor being biased to a preset voltage.

4. Device according to claim 1, wherein an additional resistor is connected between the excitation input and a common terminal between the first transistor and the detection means.

5. Device according to claim 1, wherein a third transistor is connected between the excitation input and a common terminal between the first transistor and the detection means, a control electrode of said third transistor being biased to a preset voltage.

6. Device according to claim 1, wherein the detection means are of capacitive type.

7. Device according to claim 1, wherein the detection means are of piezoresistive type.

8. Device according to claim 1, wherein the resonator is of the capacitive excitation type.

9. Device according to claim 7, wherein the resonator is of the thermoelastic excitation type.

10. Device according to claim 6, wherein the first transistor being of the suspended gate or resistive gate type, the detection means are formed by the gate of said first transistor.

11. Device according to claim 1, wherein a voltage Vcas is applied on a control electrode of the second transistor.

12. Device according to claim 7, wherein the detection means and the first transistor have a base formed by a nanowire made from semi-conducting or metallic material.

* * * * *